United States Patent
Honda et al.

(10) Patent No.: US 7,244,675 B2
(45) Date of Patent: Jul. 17, 2007

(54) ELECTRICAL CONNECTION MATERIALS AND ELECTRICAL CONNECTION METHOD

(75) Inventors: Noriyuki Honda, Kanagawa (JP); Nobuhiro Hanai, Aichi (JP); Masakazu Nakada, Aichi (JP)

(73) Assignee: Sony Corporation, Tokyo (JP)

( * ) Notice: Subject to any disclaimer, the term of this patent is extended or adjusted under 35 U.S.C. 154(b) by 849 days.

(21) Appl. No.: 09/980,024

(22) PCT Filed: Mar. 23, 2001

(86) PCT No.: PCT/JP01/02356

§ 371 (c)(1),
(2), (4) Date: May 28, 2002

(87) PCT Pub. No.: WO01/71854

PCT Pub. Date: Sep. 27, 2001

(65) Prior Publication Data

US 2002/0173145 A1  Nov. 21, 2002

(30) Foreign Application Priority Data

Mar. 23, 2000 (JP) .................. P2000-087104

(51) Int. Cl.
*H01L 21/4763* (2006.01)

(52) U.S. Cl. .................................................. 438/644
(58) Field of Classification Search ............. 438/644, 438/643, 628, 624, 620, 618, 367, 119; 257/787, 257/783, 684; 174/254–9; 29/825; 252/301.36; 430/320; 528/125
See application file for complete search history.

(56) References Cited

U.S. PATENT DOCUMENTS

| 4,554,033 A | 11/1985 | Dery et al. |
| 4,643,843 A | 2/1987 | Lowdon |
| 5,371,327 A | 12/1994 | Fujinami et al. |
| 5,641,996 A | * 6/1997 | Omoya et al. ............. 257/787 |
| 5,769,996 A | 6/1998 | Mcardle et al. |
| 6,426,566 B1 | * 7/2002 | Sawamoto ................. 257/783 |

FOREIGN PATENT DOCUMENTS

| JP | 62-15777 | 1/1987 |
| JP | 1-194209 | 8/1989 |
| JP | 5-290911 | 11/1993 |
| JP | 6-150995 | 5/1994 |

* cited by examiner

*Primary Examiner*—Laura M. Schillinger
*Assistant Examiner*—Monica D. Harrison
(74) *Attorney, Agent, or Firm*—Sonnenschein, Nath & Rosenthal LLP (57) ABSTRACT

The present invention is to provide an electrical connection material through which an electrical connection via conductive particles can be performed reliably regardless of a little unevenness of an object. The electrical connection material is an electrical connection material 100 for electrically connecting an electrical connection portion of a first object 4 and an electrical connection portion of a second object 2. The electrical connection material 100 comprises a first film-like adhesive layer 6 which is a film-like adhesive layer arranged on the first object 4 and is composed of a plurality of conductive particles 7, a first binder 8 containing the conductive particles 7, and a first filler F1 and a second film-like adhesive layer 9 which is arranged on the first film-like adhesive layer 6 and is composed of a second binder 9A whose viscosity is lower than that of the first binder 8 and a second filler F2.

4 Claims, 10 Drawing Sheets

ELECTRICAL CONNECTION MATERIALS AND ELECTRICAL CONNECTION METHOD

BACKGROUND OF THE INVENTION

The present invention relates to electrical connection materials and electrical connection methods for electrically connecting a first object electrical connection portion and a second object electrical connection portion.

BACKGROUND ART

As an example, portable type information terminals, specifically, electronic equipment such as, for example, portable telephones, are required to be compact and thin, and thus a high density, high resolution circuit employed in such electronic equipment has been developed.

For the connection between an electronic component and a fine electrode, since conventional solder or a rubber connector or the like does not deal with such connection well, an adhesive agent or a film-like material (hereafter, referred to as a connection member) which is anisotropic, excellent in a fine pitch and has conductivity has been employed frequently.

This connection member is comprised of an adhesive agent containing a predetermined amount of conductive material such as conductive particles, and this connection member is provided between a protrusion electrode of an electronic component and a conductive pattern on a printed wiring board and is pressurized conductive pattern on a printed wiring board and is pressurized or pressurized and heated so as to electrically connect both electrodes and to give an insulated relationship to electrodes formed adjacent to the electrodes. Thus, the protrusion electrode of the electronic component and the conductive pattern on the printed wiring board adhere to each other and are fixed.

Basically, as a way to make the connection member described above deal with a fine pitch, by making the particle diameter of the conductive particle smaller than the length of a insulation portion between the adjacent electrodes, the insulated relationship between the adjacent electrodes is ensured, moreover, the content by amount of the conductive particles is set to a value by which the particles do not come into contact with each other, and the particles are made to exist surely on the electrodes to obtain conductivity in the connection portion.

However, in this method, when the diameter of the conductive particle is made small, due to a remarkable increase of the surface area of the conductive particle, the conductive particles cause secondary agglomeration to couple with each other so that the insulated relationship between the adjacent electrodes cannot be maintained.

Further, when the content of the conductive particles is reduced, since the number of the conductive particles on the electrodes to be connected is reduced, the number of contact points becomes insufficient, and conductivity between the connected electrodes cannot be obtained. Thus, it is difficult to make the connection member cope with a fine pitch while maintaining a long period of electrical connection reliability. That is, the finer a pitch conspicuously becomes, the more miniaturization of the electrode area and the space between adjacent electrodes becomes, the conductive particles on the electrodes flow out between the adjacent electrodes together with the adhesive agent due to pressurization or pressurization and heating at the time of connection, thereby preventing realization a fine pitch of the connection member.

In order to solve such problems, conventionally, proposed are a connection member in which the surfaces of conductive particles are coated with an insulation material to increase the number of conductive particles in the connection member and a connection member which is composed of an adhesive layer containing conductive particles and a layer which does not contain conductive particles.

Such conventional connection members are shown in FIG. 10 and FIG. 11.

As shown in FIG. 10, when an object is a glass substrate 200, flatness in a mounting area of an IC (integrated circuit) 201 on the glass substrate 200 is ±0. several µm, and if there is little unevenness (±0. several µm) in heights of protrusion electrodes 202 of the IC 201 as being gold plated bumps, a wiring pattern 203 on the glass substrate 200 and the protrusion electrode 202 of the IC 201 can be electrically connected via conductive particles 205 contained in a connection member 204.

That is, since there is flatness in each component such as an IC, when the thickness of the connection member 204 (generally, approximately 15 to 25 µm, incidentally, an ITO (an oxide of indium and tin) pattern wired on the glass is several Å) is set to the height of the protrusion electrode 202 of the IC 201 plus 5 µm, the connection member 204 is reliably filled along the lower face of the IC 201. Thus, there is no need to make the thickness of the connection member 204 thicker than the thickness needed, and the conductive particles 205 can be sandwiched between the wiring pattern 203 on the glass substrate 200 and the protrusion electrode 202 of the IC 201 at an early stage of a temporary pressurized attachment (pressurization) in the mounting.

Thereafter, even when binder of the connection member 204 flows out at the time of a permanent pressurized attachment (pressurization and heating), the sandwiched conductive particles 205 do not flow, and the wiring pattern 203 on the glass substrate 200 and the protrusion electrode 202 of the IC 201 can be electrically connected reliably via the conductive particles 205 at the time of hardening of the connection member.

Figure 10A:
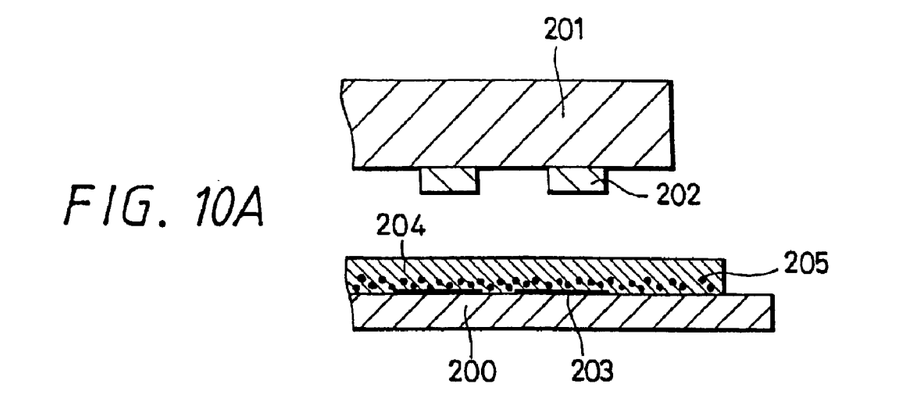
FIG. 10 are diagrams illustrating a conventional electrical connection example.

FIG. 10(A) shows a state where the connection member 204 (for example, an anisotropic conductive film: ACF) is stuck on the glass substrate 200. The anisotropic conductive film is stuck on the glass substrate 200 generally by performing thermocompression bonding (pressurization and heating: the amount of pressurization is about 100 N/cm$^2$: heating temperature is about 70 to 100° C.). In this state, positioning of the wiring pattern 203 on the glass substrate 200 and the protrusion electrode 202 of the IC 201 is performed.

Figure 10B:
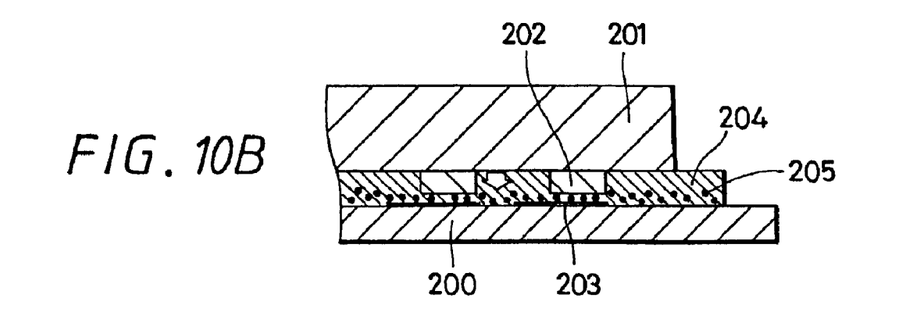

FIG. 10(B) shows a state where the IC 201 is temporarily attached to the glass substrate 200 by pressure. The temporary pressurized attachment of the IC 201 is performed only by pressurization or pressurization and heating (heating temperature is about 70 to 100° C.).

Figure 10C:
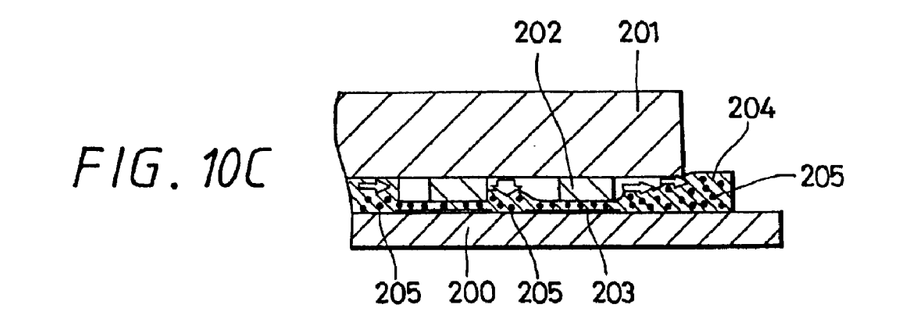

FIG. 10(C) shows a state where the IC 201 is permanently attached to the glass substrate 200 by pressure. The permanent pressurized attachment of the IC 201 is performed through pressurization and heating, and since the temperature at that time is higher than the glass transition temperature of the anisotropic conductive film, flow of the binder of the connection member 204 occurs. At this time, the conductive particles 205 sandwiched between the protrusion electrode 202 of the IC 201 and the wiring pattern 203 on the glass substrate 200 do not flow, however, the conductive particles 205 other than the sandwiched conductive particles 205 flow to the outside.

Figure 10D:
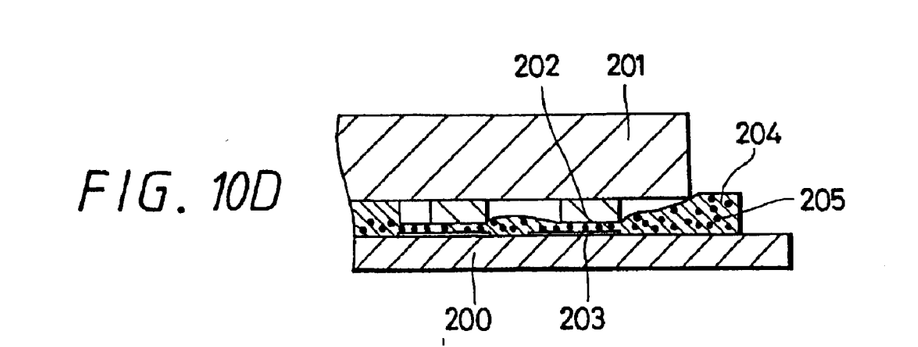

FIG. 10(D) shows a state where the anisotropic conductive film is hardened. When the pressurization and heating is performed at the permanent pressurized attachment, resin is hardened after the fluidization thereof. The series of processes are the connection process.

However, when the object is not the glass substrate but is instead a printed wiring board 300 as shown in FIG. 11, and when unevenness in height (±several μm) of wiring patterns 303 occurs or when unevenness in height (±several μm) occurs in such a case where the protrusion electrodes 202 of the IC 201 are gold wire bumps, if the thickness of the connection member 204 corresponds to the height (about 20 μm) of the wiring pattern 303 on the printed wiring board 300 plus the height (about 20 μm) of the protrusion electrode of the IC, it is necessary to further add 10 to 20 μm to the thickness of the connection member 204, considering reliability in the connecting.

In this case, at the early stage of the temporary pressurized attachment (pressurization) of the mounting, since the connection member 204 is thick, the conductive particles 205 cannot be sandwiched between the wiring pattern 303 on the printed wiring board 300 and the protrusion electrode 202 of the IC 201. Thereafter, when the binder of the connection member 204 flows at the time of permanent pressurized attachment (pressurization and heating), the conductive particles 205 also flow similarly, and when the distance between the wiring pattern 303 on the printed wiring board 300 and the protrusion electrode 202 of the IC 201 corresponds to the size of the conductive particle 205, the conductive particles 205 which have flowed are sandwiched during that time. However, the conductive particles 205 do not participate in all connections, and thus electrical connections cannot be obtained. Or since it is necessary to obtain components with strict specifications, the cost increases.

Figure 11A:
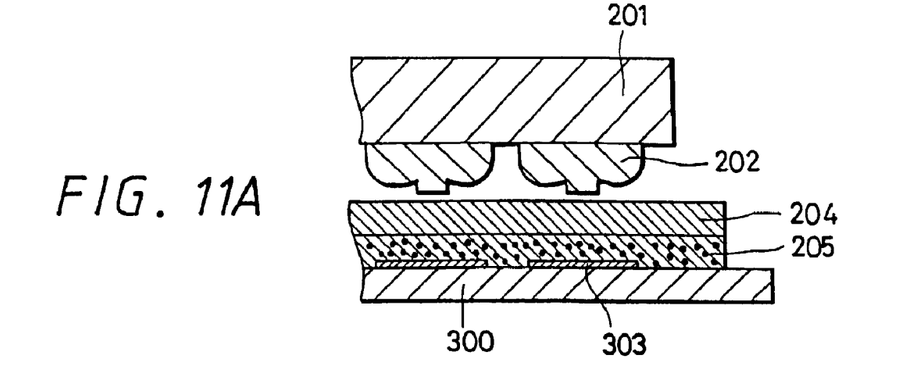
FIG. 11 are diagrams illustrating another conventional electrical connection example.

FIG. 11(A) shows a state where the connection member 204 (for example, anisotropic conductive film) is stuck on the printed wiring board 300. The anisotropic conductive film is stuck on the printed wiring board 300 generally by performing thermocompression bonding (pressurization and heating: the amount of pressurization is about 50 to 100 N/cm$^2$: heating temperature is about 50 to 100° C.). In this state, positioning of the wiring pattern 303 on the printed wiring board 300 and the protrusion electrode 202 of the IC 201 is performed.

Figure 11B:
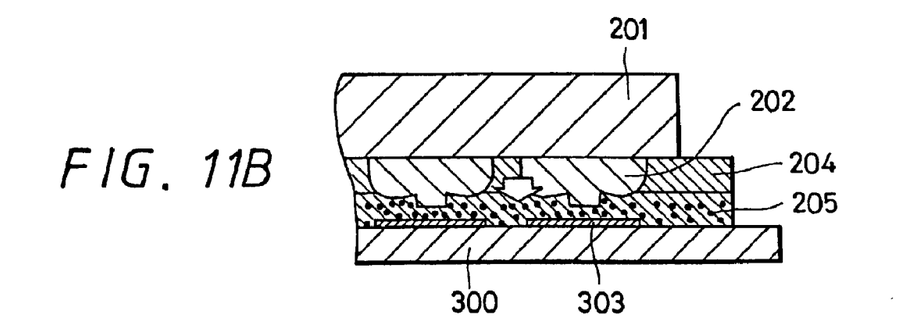

FIG. 11(B) shows a state where the IC 201 is temporarily attached to the printed wiring board 300 by pressure. The temporary pressurized attachment of the IC 201 is performed only by pressurization or pressurization and heating (heating temperature is about 70 to 100° C.).

Figure 11C:
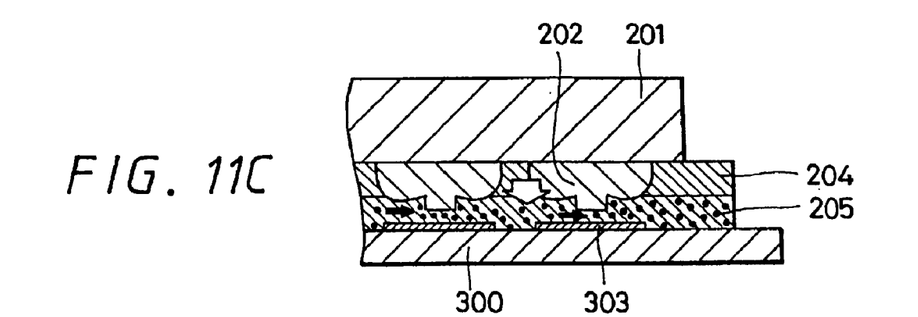

FIG. 11(C) shows a state where the IC 201 is permanently attached to the printed wiring board 300 by pressure. The permanent pressurized attachment of the IC 201 is performed through pressurization and heating, and since the temperature at this time is higher than the glass transition temperature of the anisotropic conductive film, flow of the binder occurs. At this time, since there is no conductive particles 205 sandwiched between the protrusion electrode 202 of the IC 201 and the wiring pattern 303 on the printed wiring board 300, all conductive particles 205 flow as shown by arrows in FIG. 11(C). Thus, when the distance between the wiring pattern 303 on the printed wiring board 300 and the protrusion electrode 202 of the IC 201 corresponds to the size of the conductive particle 205, the conductive particles 205 which have flowed are sandwiched during that time. Therefore, it does not means that the conductive particles 205 exist among all electrodes.

Figure 11D:
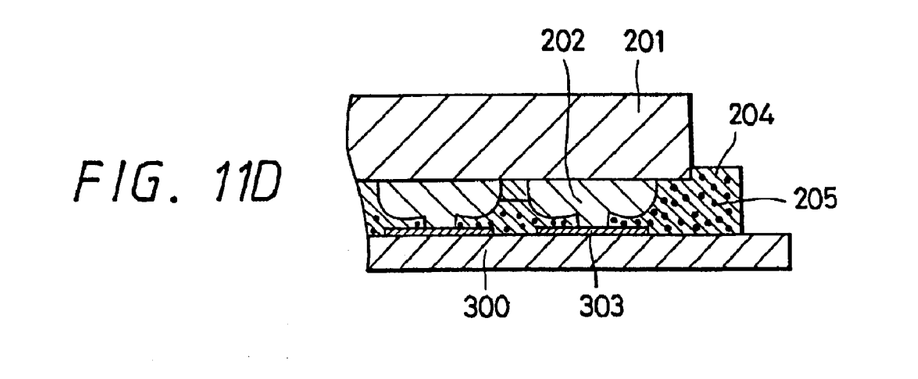

FIG. 11(D) shows a state where the anisotropic conductive film is hardened. When the pressurization and heating is performed at the permanent pressurized attachment, resin is hardened after the fluidization thereof. However, the conductive particles 205 are not sandwiched between the protrusion electrode 202 and the wiring pattern 303, and electrical connection cannot be obtained.

Accordingly, for example, if an electrical connection via conductive particles is obtained reliably regardless of a little unevenness on printed wiring boards to be an object or regardless of a little unevenness of protrusion electrodes of an IC, it is deemed that sufficient reliability is obtained in practical use even on a printed wiring board whose cost is restrained.

DISCLOSURE OF THE INVENTION

The present invention was developed considering the above points, and an object of the present invention is to provide electrical connection materials and electrical connection methods by which an electrical connection via conductive particles can be reliably performed regardless of a little unevenness in objects.

One aspect of the disclosed invention(s) is an electrical connection material for electrically connecting an electrical connection portion of a first object and an electrical connection portion of a second object and is an electrical connection material characterized by being comprised of a first film-like adhesive layer which is a film-like adhesive layer arranged on the first object and is composed of a plurality of conductive particles, a first binder containing the conductive particles, and a first filler and a second film-like adhesive layer which is arranged on the first film-like adhesive layer and is composed of a second binder whose viscosity is lower than that of the first binder and a second filler.

In one aspect of the disclosed invention(s) the first film-like adhesive layer is a film-like adhesive layer arranged on the first object and is composed of a plurality of conductive particles, the first binder containing the conductive particles, and the first filler.

The second film-like adhesive layer is arranged on the first film-like adhesive layer and is composed of the second binder and the second filler.

The viscosity of the second binder of the second film-like adhesive layer is set to a value lower than that of the first binder.

By arranging the first film-like adhesive layer for the first object and by pressurizing and heating the second film-like adhesive layer through the second object, only the second film-like adhesive layer flows. Thus, even when there is a little unevenness on the first object, the first object and the second object can be stuck. Therefore, the electrical connection portion of the first object can be electrically connected reliably to the electrical connection portion of the second object, employing the conductive particles of the first film-like adhesive layer.

In another aspect, the conductive particles have an approximately uniform particle diameter. Since the conductive particles have an approximately uniform particle diameter, the electrical connection portion of the first object and the electrical connection portion of the second object can be electrically connected without rising while having a shape sandwiching the conductive particles reliably.

In another aspect, the material of the second film-like adhesive layer composed of the second binder and the second filler is a binder made of the same material as that of or a material similar to the first binder of the first film-like adhesive layer containing the conductive particles.

Since the second film-like adhesive layer is a binder made of the same material as that of or a material similar to the binder of the first film-like adhesive layer, the binders of the first and second film-like adhesive layers react through pressurization and heating so as to glue the first object and the second object.

Suppose the material of the second binder of the second film-like adhesive layer is different from the material of the first binder of the first film-like adhesive layer, after both the binders are hardened while being mixed, inferred is a possibility that a problem of connection reliability occurs.

In another aspect, the viscosity of the second film-like adhesive layer becomes extremely lower than the viscosity of the first film-like adhesive layer in a heating process. The viscosity of the second film-like adhesive layer is not necessarily required to be low at room temperature but is required to be extremely lower than that of the first film-like adhesive layer in the process of a thermocompression bonding. On the other hand, when the viscosity of the second film-like adhesive layer is too low at room temperature, a sticking work becomes hard to do.

In another aspect, the thickness of the first film-like adhesive layer containing the conductive particles is set to from approximately the same thickness as the diameter of the conductive particles up to about 4 times the diameter.

The conductive particles do not protrude from the first film-like adhesive layer containing the conductive particles. That is, the thickness of the first film-like adhesive layer may be a thickness which can be ensured by the conductive particles, and the thickness of the second film-like adhesive layer has to have a thickness by which the second film-like adhesive layer is reliably filled so that voids do not exist between the first object and the second object.

In another aspect, in order that the viscosity of the second film-like adhesive layer composed of the second binder and the second filler is set to a value lower than the viscosity of the first film-like adhesive layer containing the conductive particles, the diameter of the second filler is set to a value larger than the diameter of the first filler.

Since the viscosity of the second binder is set to a value lower than the viscosity of the first binder, the second film-like adhesive layer between the first object and the second object flows preferentially by heating and pressurization, and thus the first film-like adhesive layer containing the conductive particles does not move, whereby the position of the conductive particles can be maintained surely.

The diameter of the second filler particles contained in the second film-like adhesive layer is set to a value larger than the diameter of the first filler particles contained in the first film-like adhesive layer. Since the diameter of the second filler particles is set to a value larger than the diameter of the first filler particles, it is possible that the viscosity of the second film-like adhesive layer containing the second filler particles with a larger diameter is lower and the viscosity of the first film-like adhesive layer containing the first filler particles is higher.

In another aspect, in order that the viscosity of the second film-like adhesive layer composed of the second binder and the second filler is set to a value lower than the viscosity of the first film-like adhesive layer containing the conductive particles, the content by amount of the second filler is set to a value smaller than the content of the first filler.

Since the viscosity of the second binder is set to a value lower than the viscosity of the first binder, the second film-like adhesive layer between the first object and the second object flows preferentially by heating and pressurization, and thus the first film-like adhesive layer containing the conductive particles does not move, whereby the position of the conductive particles can be maintained surely.

The content of the second filler contained in the second film-like adhesive layer is set to a value smaller than the content of the first filler contained in the first film-like adhesive layer. Since the content of the second filler is set to a value smaller than the content of the first filler, it is possible that the viscosity of the second film-like adhesive layer containing the second filler with a small content is lower and the viscosity of the first film-like adhesive layer containing the first filler is higher.

In another aspect, the first filler and the second filler are materials reducing the coefficient of water absorption and the coefficient of linear expansion of a binder.

By selecting a material for the first filler and the second filler, which can reduce the coefficient of water absorption and the coefficient of linear expansion of an adhesive layer, for example, the reliability of the electrical connection between a wiring pattern on a circuit substrate and a protrusion electrode of an electrical component can be improved.

By reducing the water absorption coefficient of an adhesive layer, occurrence of package crack due to moisture absorption of the adhesive layer can be restrained in a production process accompanied by a reflow furnace.

By reducing the linear expansion coefficient, stress developed from the difference of the linear expansion coefficients of the first object and the second object due to thermal stress can be mitigated in the adhesive layer, and the connection reliability for thermal stress can be improved.

In another aspeet, the electrical connection portion of the first object is a wiring pattern on a circuit substrate, the electrical connection portion of the second object is a protrusion electrode of an electrical component, and the conductive particles in the first film-like adhesive layer containing the conductive particles electrically connect the wiring pattern on the circuit substrate and the protrusion electrode of the electrical component.

In another aspect, the elements of the first binder containing the conductive particles and the second binder of the second film-like adhesive layer are the same or approximately similar.

In another aspect there is an electrical connection material comprising a first film-like adhesive layer composed of a first binder and a first filler and a second film-like adhesive layer which is composed of a second binder and a second filler and is arranged on the first film-like adhesive layer, characterized in that said first binder is made of a first high molecular resin material and said second binder is made of a second high molecular resin material whose molecular weight is smaller than that of said first high molecular resin material.

In another aspect, in order to make the viscosity of the second film-like adhesive layer lower than that of the first film-like adhesive layer, a high molecular resin material whose molecular weight is smaller than that of the first binder constituting the first film-like adhesive layer is employed as the second binder constituting the second film-like adhesive layer to realize a low viscosity.

In another aspect is an electrical connection method for electrically connecting an electrical connection portion of the first object and an electrical connection portion of the second object and is an electrical connection method characterized by comprising an adhesive layer arrangement step for arranging a first film-like adhesive layer which is composed of a plurality of conductive particles, a first binder containing the conductive particles, and a first filler on the electrical connection portion of the first object and a second film-like adhesive layer which is composed of a second binder and a second filler on the first film-like adhesive layer, and a connection step for performing heating and pressurization for electrically connecting the electrical connection portion of the first object and the electrical connection portion of the second object by means of the conductive particles of the first film-like adhesive layer.

In this aspect, at the adhesive layer arrangement step, the first film-like adhesive layer is arranged on the electrical connection portion side of the first object, and the second film-like adhesive layer is arranged on the electrical connection portion side of the second object.

At the connection step, in order to electrically connect the electrical connection portion of the first object and the electrical connection portion of the second object by the conductive particles in the first film-like adhesive layer, heating and pressurization are performed.

Thus, only by arranging the first film-like adhesive layer and the second film-like adhesive layer, the conductive particles of the first film-like adhesive layer do not move, and only the second film-like adhesive layer flows. Therefore, even when there is a little unevenness of the first object, the first object and the second object can be stuck, and the electrical connection portion of the first object can be electrically connected reliably to the electrical connection portion of the second object, employing the conductive particles of the first film-like adhesive layer.

In another aspect, the connection step comprises a first pressurization heating step for heating and pressurizing the first film-like adhesive layer and the second film-like adhesive layer in a temperature range of ±20° C. centering a temperature at which the viscosity of the second film-like adhesive layer becomes the lowest and a second pressurization heating step for thereafter heating and pressurizing the first film-like adhesive layer and the second film-like adhesive layer at a temperature higher than reaction start temperature of the first film-like adhesive layer and the second film-like adhesive layer.

In this aspect, the first pressurization heating step is performed where the second film-like adhesive layer is heated and pressurized in a range of ±20° C. centering a temperature at which the viscosity of the second film-like adhesive layer becomes the lowest. Then, at the second pressurization heating step, the first film-like adhesive layer and the second film-like adhesive layer are heated and pressurized at a temperature higher than reaction start temperature of the first film-like adhesive layer and the second film-like adhesive layer.

At the first pressurization heating step, since the viscosity of the first film-like adhesive layer is higher than the viscosity of the second film-like adhesive layer, the second film-like adhesive layer is fluidized. Thus, the conductive particles are not fluidized in the first film-like adhesive layer containing the conductive particles, and the conductive particles can be made to exist, for example, between the wiring pattern on the circuit substrate and the protrusion electrode of the electrical component reliably.

At the second pressurization heating step, by heating and pressurizing at a temperature higher than the reaction start temperature, the first film-like adhesive layer and the second film-like adhesive layer are completely hardened.

In another aspect, even in a temperature range of ±20° C. centering a temperature at which the viscosity of the first film-like adhesive layer containing the conductive particles and the viscosity of the second film-like adhesive layer become the lowest, the viscosity of the first film-like adhesive layer containing the conductive particles is higher than the viscosity of the second film-like adhesive layer, therefore the second film-like adhesive layer is fluidized. The conductive particles of the first film-like adhesive layer containing the conductive particles is not fluidized, and the conductive particles in the first film-like adhesive layer containing the conductive particles are made to exist between the wiring pattern on the circuit substrate and the protrusion electrode of the electrical component to electrically connect the wiring pattern and the protrusion electrode.

In another aspect, the becoming-lowest-temperature is 80° C.

DETAILED DESCRIPTION OF THE INVENTION

Hereafter, one preferred embodiment of the present invention is explained in detail based on attached drawings.

Since an embodiment described below is a preferred specific example of the present invention, various limitations which are technically preferred are added, however, the scope of the present invention is not limited to the features as far as there is no description that the present invention is limited specifically in the following explanation.

Figure 1:
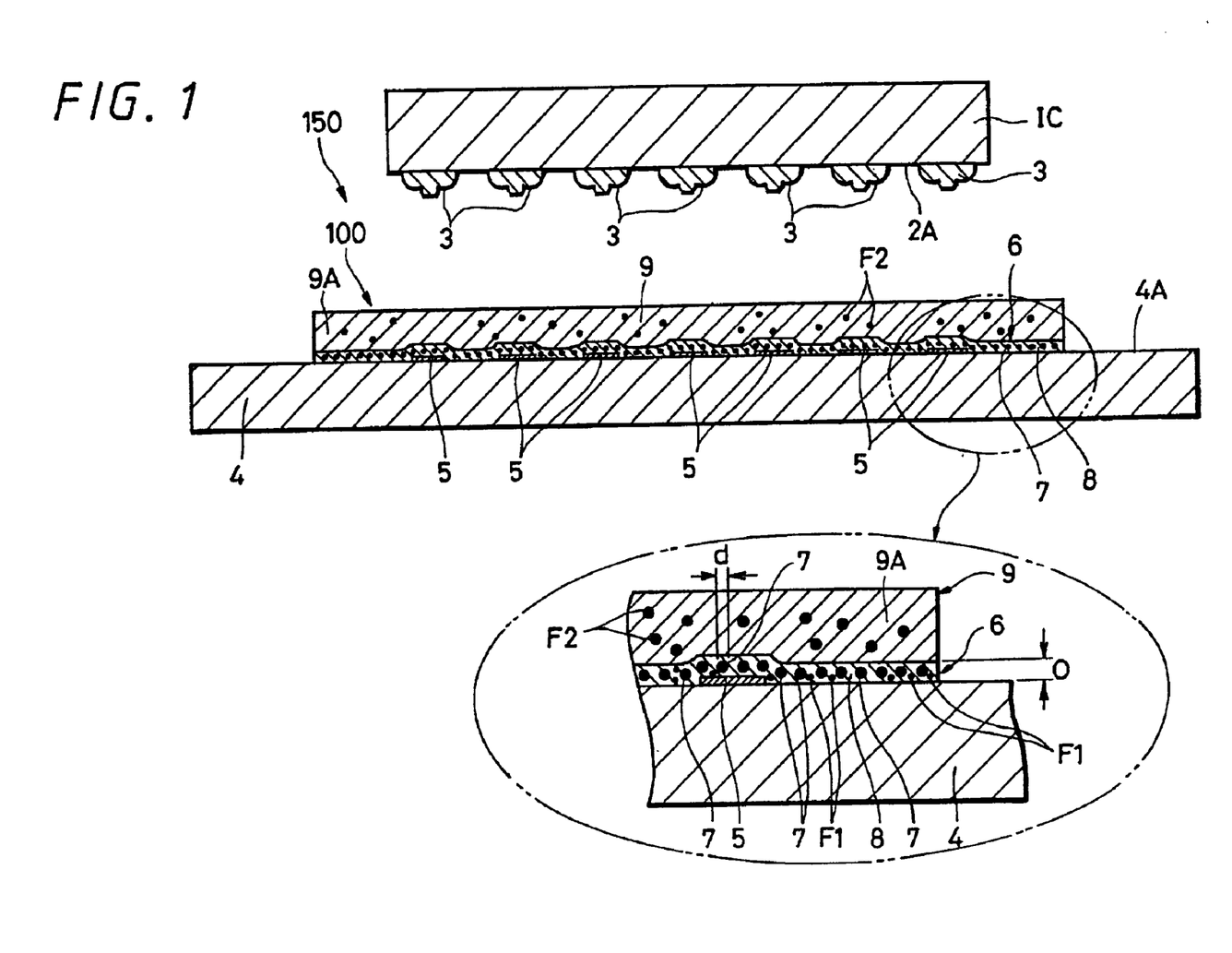
FIG. 1 is a diagram illustrating one example of an electrical device having an electrical connection material of the present invention.

FIG. 1 shows one example of an electrical device 150 electrically connected according to a preferred embodiment of an electrical connection material 100 of the present invention. This electrical device 150 is provided with a printed wiring board 4 and an IC (integrated circuit) 2 as an example of an electrical component.

A wiring pattern 5 in a shape of a predetermined pattern is formed on one face 4A of the printed wiring board 4. This wiring pattern 5 is an electrical wiring pattern formed, for example, by aluminum and copper.

On the IC 2, a plurality of protrusion electrodes 3 are provided, for example, on one face 2A. These protrusion electrodes 3 are also called bumps, and the protrusion electrodes 3 are, for example, arranged while being protruded corresponding to the wiring pattern 5 on the printed wiring board 4.

The printed wiring board 4 corresponds to a first object, and the wiring pattern 5 on the printed wiring board 4 corresponds to a wiring pattern on a circuit substrate. The IC 2 is an electrical component corresponding to a second object. The electrical connection material 100 has a function for electrically connecting the wiring pattern 5 on the printed wiring board 4 and the protrusion electrodes 3 of the IC 2 and for mechanically gluing the printed wiring board 4 and the IC 2 reliably.

Next, the electrical connection material 100 is explained in detail.

The electrical connection material 100 has a first film-like adhesive layer 6 and a second film-like adhesive layer 9. As shown in FIG. 1, the first film-like adhesive layer 6 contains a first binder 8, conductive particles 7, and a first filler F1. The second film-like adhesive layer 9 is composed of a second binder 9A and a second filler F2.

The first film-like adhesive layer 6 containing the conductive particles 7 is of a film-like object arranged on the face 4A of the printed wiring board 4, and the first film-like adhesive layer 6 is stuck on the face 4A of the printed wiring board 4 so as to cover the wiring pattern 5.

Many or a plurality of conductive particles 7 and the first filler particles F1 in the first film-like adhesive layer 6 are contained so as to be dispersed approximately uniformly in the first binder 8. The conductive particles 7, for example, are particles formed by plating of Ni (300 to 1000 Å thickness) on plastic resin particles (diameter 5 μm) and further plating of Au (300 to 1000 Å thickness) thereon or are globular particles formed of metal powder of Ni (5to 10μm diameter).

The diameter of the first filler particles F1 which is smaller than or the same as that of the conductive particles 7 is preferable. Regarding the first filler F1, by selecting a material which can reduce the coefficient of water absorption and/or the coefficient of linear expansion of the binder and/or can give electrical insulation property, the reliability of the electrical connection between a wiring pattern on a circuit substrate and a protrusion electrode of an electrical component can be improved. That is, when the water absorption coefficient of the binder is reduced, occurrence of package crack due to moisture absorption of an adhesive layer can be restrained, for example, in a production process accompanied by a reflow furnace.

When the linear expansion coefficient of the binder is reduced, stress developed from the difference of the linear expansion coefficients of the first object and the second object due to thermal stress can be mitigated in the adhesive layer, and the connection reliability for the thermal stress can be improved.

For example, silica or the like is preferable as the material of the first filler F1 which has an effect for that improvement.

The first binder 8 is a binder to contain a plurality or many conductive particles 7 and the first filler particles F1 and is further to retain them so that they are not moved. The first binder 8 is, for example, formed of a thermosetting epoxy resin which has electrical isolation property.

It is preferable that the thickness D of the first binder 8 is set to from the same thickness as the diameter d of the conductive particle 7 up to about 4 times the diameter d. Thus, the conductive particles 7 are completely contained and retained in the first binder 8 without protruding to the outside of the first binder 8 which is an electrical isolation layer.

The conductive particles 7 are preferably ranged in line or are dispersed uniformly in the first binder 8 as shown in FIG. 1. The first filler particles F1 are also dispersed uniformly in the first binder 8.

Next, the second film-like adhesive layer 9 composed of the second binder 9A and the second filler F2 in FIG. 1 is arranged on the first film-like adhesive layer 6 and is combined therewith to form a two-layer structure.

The second film-like adhesive layer 9 is provided with the second binder 9A and the second filler F2. Many or a plurality of the second filler particles F2 are contained in the second binder 9A while being ranged in line or dispersed uniformly.

As the second binder 9A in the second film-like adhesive layer 9, an adhesive material which contains the same element as the material of the first binder 8 and has an electrical isolation property can be adopted. The first binder 8 in the first film-like adhesive layer 6 is, for example, formed of a thermosetting epoxy resin. As the first binder 8 and the second binder 9A in the second film-like adhesive layer 9, a binder of the same reactivity preferably by which the same reaction is occurred at the time of pressurization and heating can be adopted.

It is preferable that the viscosity of the second film-like adhesive layer 9 is set to a value lower than the viscosity of the first film-like adhesive layer 6. That is, the second film-like adhesive layer 9 has a higher fluidity compared with the first film-like adhesive layer 6 containing the conductive particles 7, and when the IC 2 is pressed on the face 4A of the printed wiring board 4 via the electrical connection material 100, only the second film-like adhesive layer 9 can flow and fill up between the first film-like adhesive layer 6 containing the conductive particles 7 and the face 2A of the IC 2.

In order to obtain the viscosity and flow characteristics of the electrical connection material 100 as described above, the second filler particles F2 contained in the second film-like adhesive layer 9 which have a larger diameter than that of the first filler particles F1 contained in the first film-like adhesive layer 6 containing the conductive particles 7 are employed.

Figure 8:
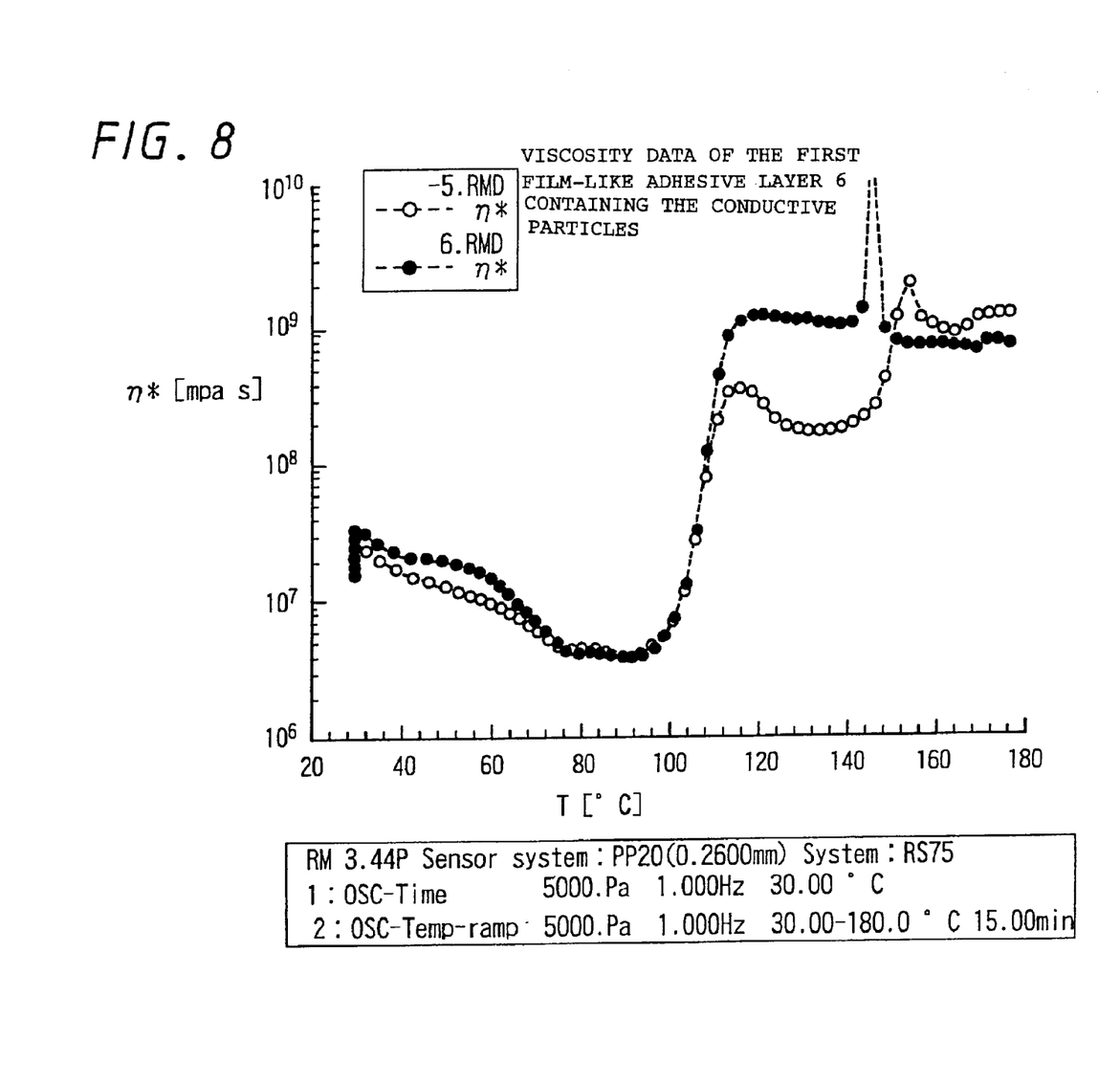
FIG. 8 is a graph showing an example of viscosity data of a first film-like adhesive layer.
Figure 9:
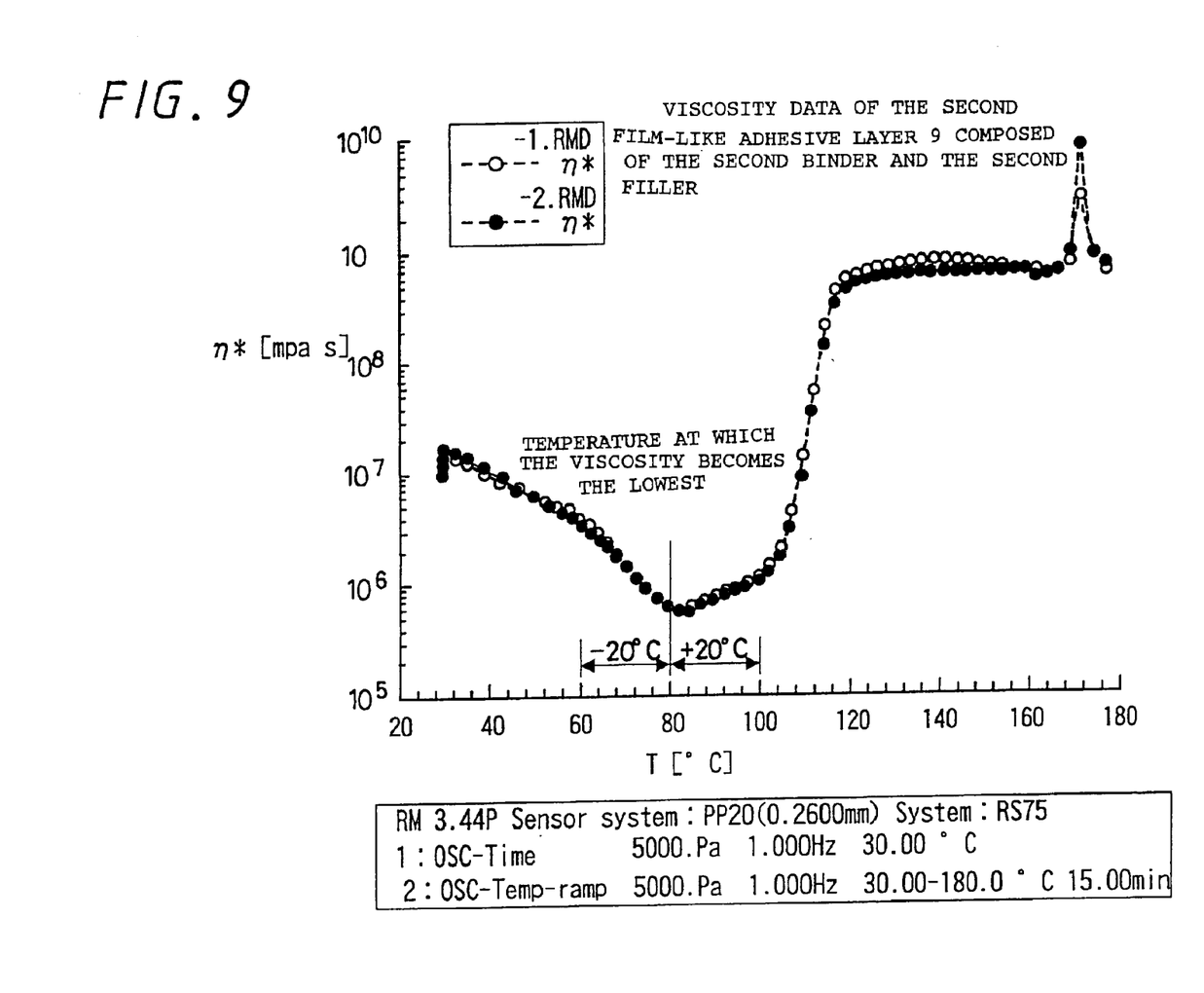
FIG. 9 is a graph showing an example of viscosity data of a second film-like adhesive layer.

FIG. 8 shows an example of viscosity data of the first film-like adhesive layer 6 containing the conductive particles 7. FIG. 9 shows an example of viscosity data of the second film-like adhesive layer 9 composed of the second binder 9A and the second filler F2.

Referring to FIG. 8 and FIG. 9, as it is obvious from the viscosity data of the first film-like adhesive layer 6 containing the conductive particles and the viscosity data of the second film-like adhesive layer 9, the viscosity of the first film-like adhesive layer 6 containing the conductive particles 7 is higher at any temperature than that of the second film-like adhesive layer 9.

The overall viscosity from the viscosity data of the second film-like adhesive layer 9 in FIG. 9 is lower than that from the temperature data of the first film-like adhesive layer 6 in FIG. 8. From this view point, it can be said that the fluidity of the second film-like adhesive layer 9 is higher than that of the first film-like adhesive layer 6.

Further, as the materials of the first binder 8 and the second binder 9A, for example, bisphenol type epoxy resin, modified epoxy resin, amino hardening agent, phenoxy resin, and the like can be employed, however, as other examples, low molecular bisphenol type epoxy resin is employed as the second binder 9A and high molecular bisphenol type epoxy resin is employed as the first binder 8 so that a difference in the viscosity can be obtained.

Next, a preferred embodiment of a connection method by which the IC 2 is electrically connected to the printed wiring board 4, employing the electrical connection material 100, is explained referring to FIG. 2 to FIG. 6.

Figure 4:
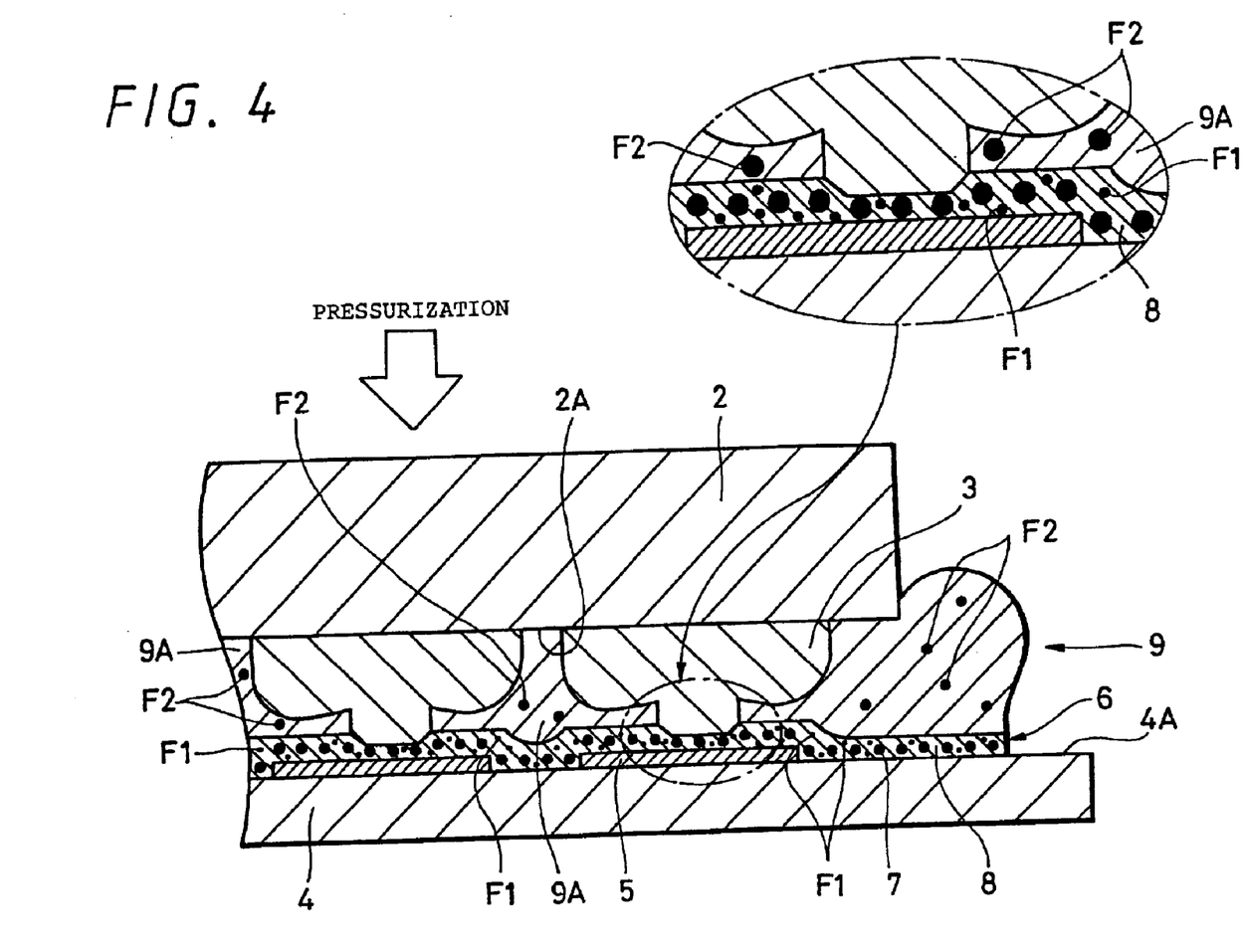
FIG. 4 is a diagram illustrating a state after the IC is attached to the printed wiring board by pressure via the electrical connection material.
Figure 5:
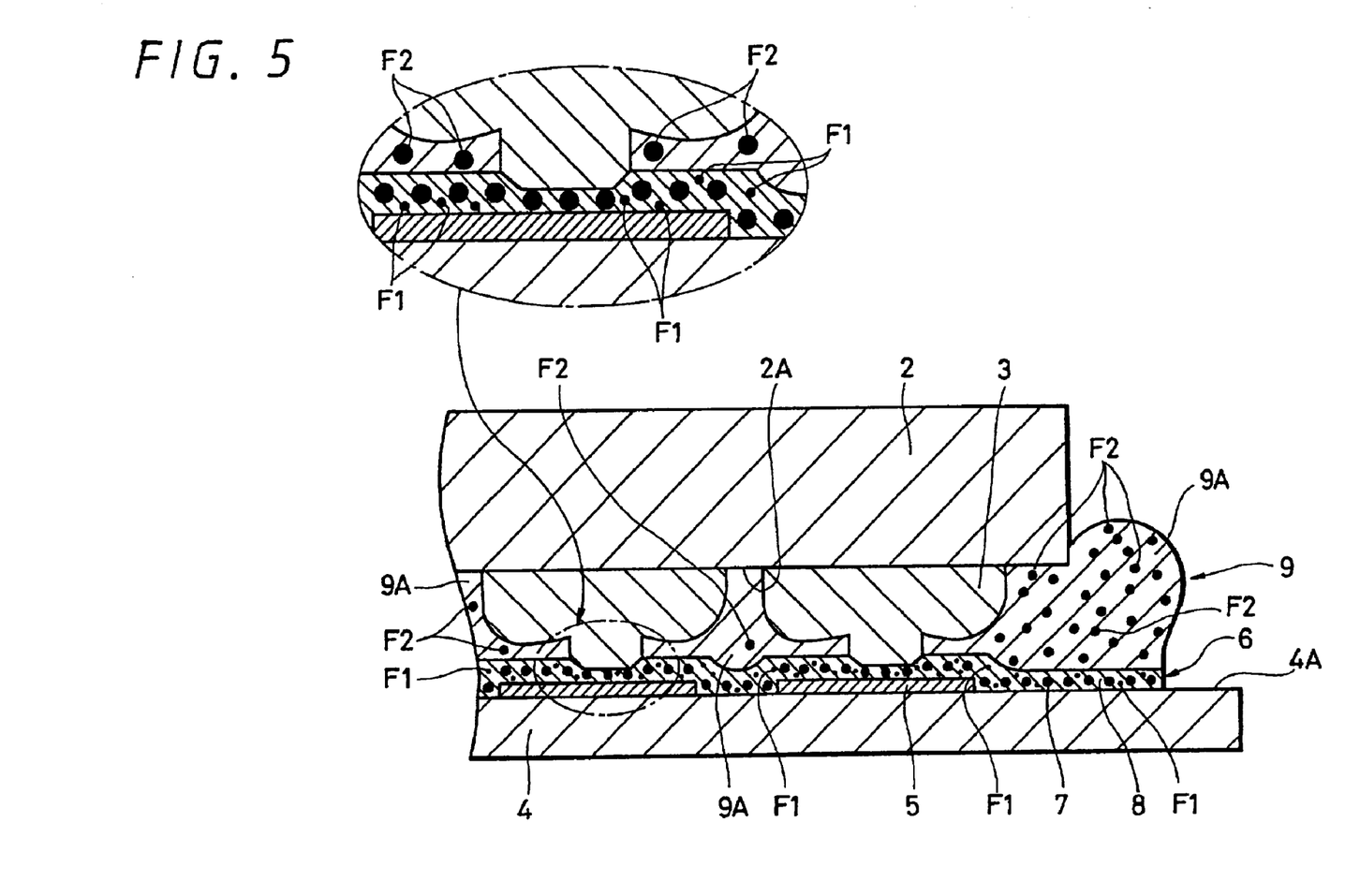
FIG. 5 is a diagram illustrating a state where the IC is completely electrically connected to the printed wiring board.
Figure 6:
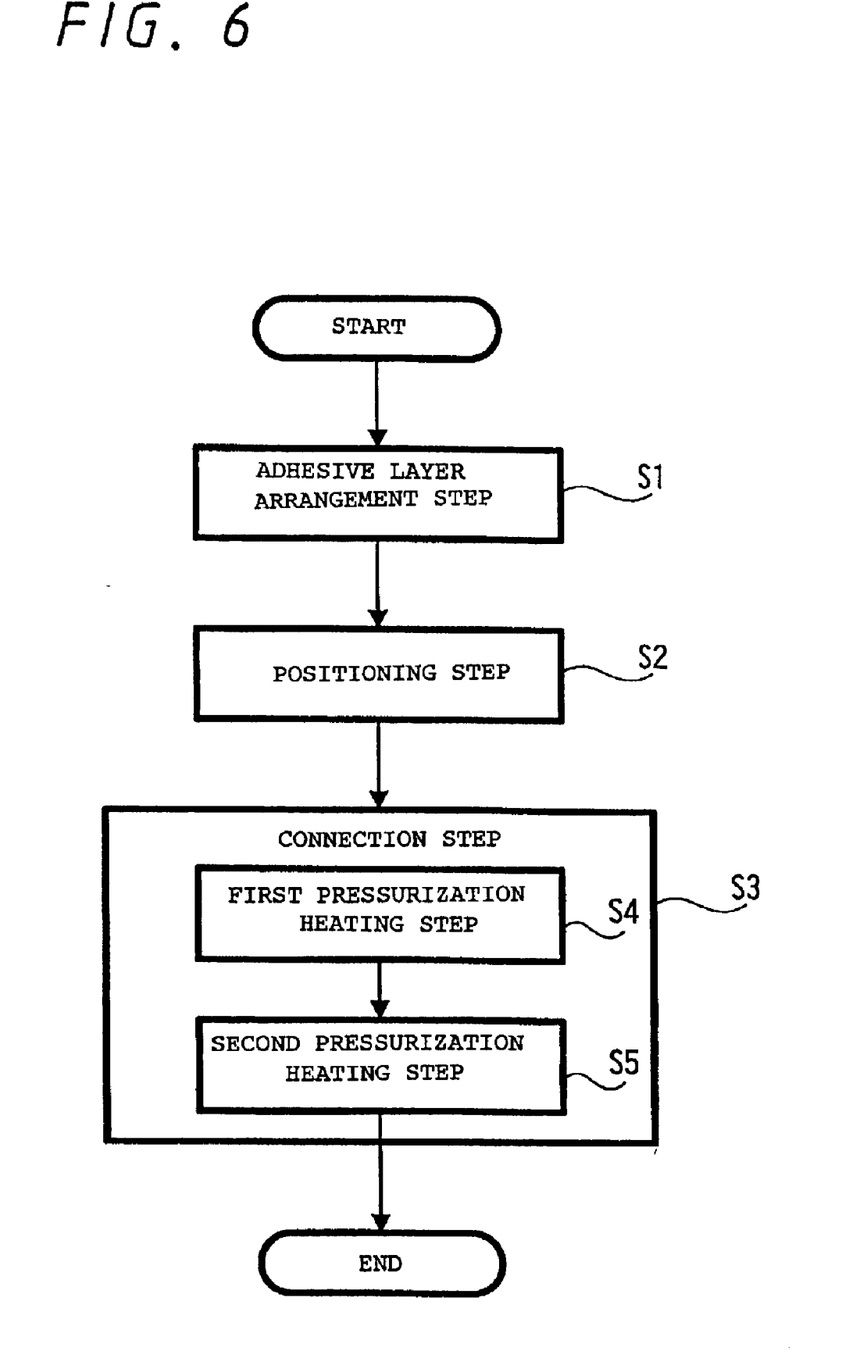
FIG. 6 is a flow chart showing an example of an electrical connection method of the present invention.

FIG. 2 to FIG. 5 sequentially show the method of electrical connection employing the electrical connection material 100, and FIG. 6 is a flow chart showing the electrical connection method.

Figure 2:
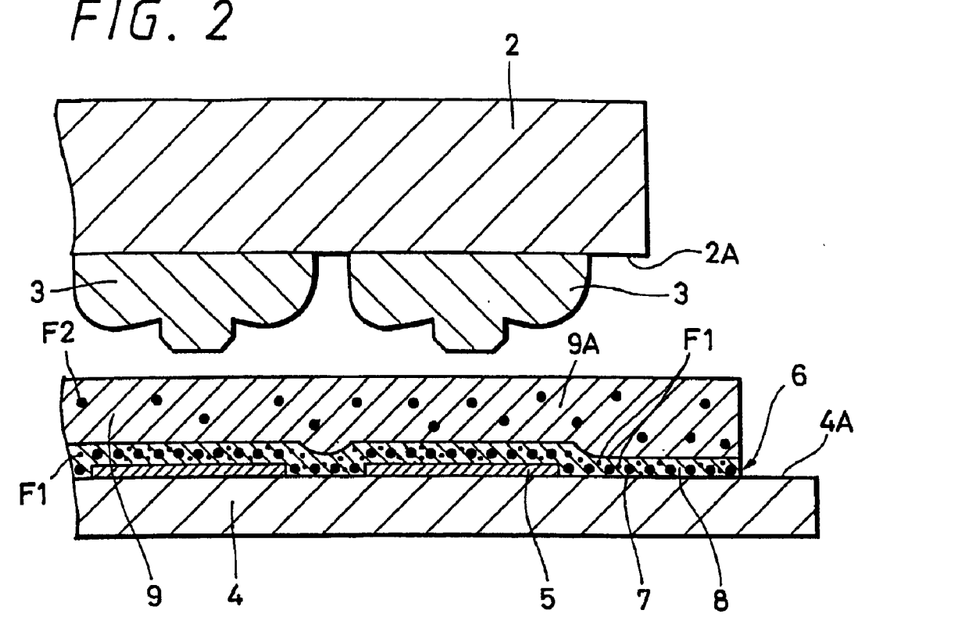
FIG. 2 is a diagram illustrating a state before an IC is connected with a printed wiring board, employing the electrical connection material in FIG. 1.

At adhesive layer arrangement step S1 in FIG. 6, the first film-like adhesive layer 6 containing the conductive particles 7 is stuck on the face 4A of the printed wiring board 4 as shown in FIG. 1 and FIG. 2. In this case, the first film-like adhesive layer 6 is stuck so as to cover the wiring pattern 5. The conductive particles 7 are completely contained and are retained in the first binder 8. This is because the thickness of the first binder 8 is from the same as the diameter of the conductive particle 7 up to about 4 times the diameter.

The second film-like adhesive layer 9 is arranged on the first film-like adhesive layer 6 to form a two-layer structure of the first film-like adhesive layer 6 and the second film-like adhesive layer 9.

At positioning step S2 in FIG. 6, the IC 2 is positioned toward the printed wiring board 4 as shown in FIG. 1 and FIG. 2. That is, the protrusion electrode 3 of the IC 2 is positioned at a position corresponding to the wiring pattern 5.

Connection step S3 in FIG. 6 includes first pressurization heating step S4 and second pressurization heating step S5.

Figure 3:
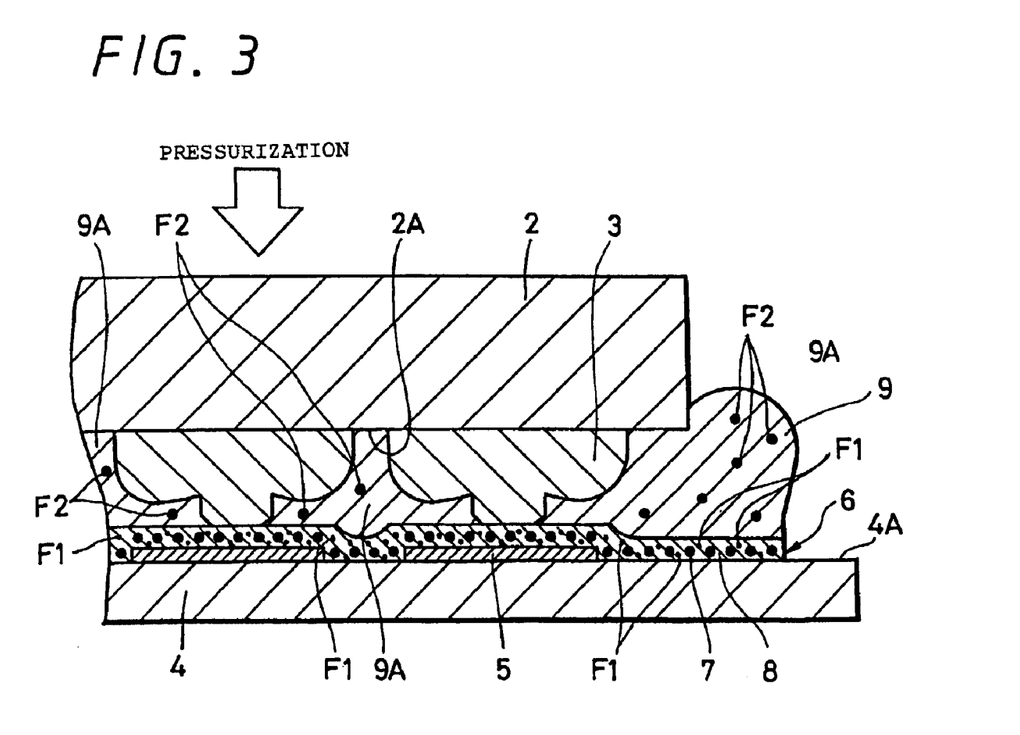
FIG. 3 is a diagram illustrating a state where the IC is pressed against the printed wiring board via the electrical connection material.

At the first pressurization heating step S4, the IC 2 is placed on the first film-like adhesive layer 6 containing the conductive particles 7 so that the second film-like adhesive layer 9 flows and spreads, and the first film-like adhesive layer 6 containing the conductive particles 7 retains the shape thereof as shown in FIG. 3.

Therefore, the second film-like adhesive layer 9 is filled between the face 2A of the IC 2 and the first film-like adhesive layer 6 as shown in FIG. 3. This is because the viscosity of the second film-like adhesive layer 9 is lower than that of the first film-like adhesive layer 6, only the second film-like adhesive layer 9 spreads to the vicinity thereof so that the second film-like adhesive layer 9 is filled between the face 2A of the IC 2 and the first film-like adhesive layer 6. In the state of FIG. 3, the second film-like adhesive layer 9 is only temporarily hardened.

The temperature at this time is a temperature at which the viscosity of the second film-like adhesive layer 9 composed of the second binder 9A and the second filler F2 becomes the lowest or is in a temperature range thereabout. For example, as shown in FIG. 9, the temperature at which the viscosity of the second film-like adhesive layer 9 becomes the lowest is 80° C., and since electrical connection reliability is excellent in a temperature range of ±20° C. of the vicinity centering 80° C., heating and pressurization is performed in the temperature range of 60 to 100° C. When the temperature of the heating time is, for example, 80° C., the heating time is, for example, about 5 seconds.

The pressure at that time is about a pressure or less by which the conductive particles 7 existing between the wiring pattern 5 on the printed wiring board 4 and the protrusion electrode 3 of the IC 2 are transformed, for example, 2 μm or more after the second pressurization heating step S5 and that is, for example, 10 Kgf/mm$^2$ (100 Pa) for the area of the face of the protrusion electrode 3 of the IC 2 connected to the wiring pattern 5 on the printed wiring board 4 via the conductive particles 7 is imparted while heating.

Then, at the second pressurization heating step S5 in FIG. 6, as shown in FIG. 4, the pressure is given as much as that by which the conductive particles 7 existing between the wiring pattern 5 on the printed wiring board 4 and the protrusion electrode 3 of the IC 2 can be transformed, for example, 2 μm or more after the second pressurization heating step S5, and the first binder 8 and the second film-like adhesive layer 9 are heated at a higher temperature.

The temperature at this time is a temperature higher than reaction start temperature of the first binder 8 and the second film-like adhesive layer 9, for example, 180° C. to 230° C., and heating is performed at this temperature for 20 seconds to 30 seconds.

Therefore, the pressure at that time to be given is, for example, about 10 to 15 Kgf/mm$^2$ (150 Pa) for the area of the face of the protrusion electrode 3 of the IC 2 connected to the wiring pattern 5 on the printed wiring board 4 via the conductive particles 7. Since being preferably the same or similar element, the first binder 8 of the first film-like adhesive layer 6 and the second binder 9A of the second film-like adhesive layer 9 can be hardened approximately at the same time.

As a result, as shown in FIG. 5, each protrusion electrode 3 can be connected electrically reliably with the wiring pattern 5, employing the conductive particles 7 of the first film-like adhesive layer 6 containing the conductive particles 7.

As described above, when the IC 2 is heated while being pressured toward the printed wiring board 4 side, since not the first film-like adhesive layer 6 containing the conductive particles 7 but only the second film-like adhesive layer 9 flows to the outside, even if there is a little unevenness on the IC 2 and the printed wiring board 4, the electrical insulation property of the IC 2 and the printed wiring board 4 can be sufficiently ensured.

Since not the first film-like adhesive layer 6 but only the second film-like adhesive layer 9 flows, even when there is a little unevenness on the IC 2 and the printed wiring board 4, since all voids (area of air) between the IC 2 and the printed wiring board 4 are filled with a binder and a filler, the reliability is improved.

Further, by pressurization and heating, since the second film-like adhesive layer 9 and the first binder 8 are hardened, these second film-like adhesive layer 9 and first film-like adhesive layer 6 which have adhesive property can reliably glue and fix the IC 2 to the printed wiring board 4 side.

At the first pressurization heating step S4 in FIG. 3, the conductive particles 7 are positioned so as to be sandwiched between the protrusion electrode 3 and the wiring pattern 5. In FIG. 4, when pressurization whose amount is similar or stronger than that in the first pressurization heating step S4 is performed, only the conductive particles 7 positioned between the protrusion electrode 3 and the wiring pattern 5 are electrically connected while being sandwiched between the protrusion electrode 3 and the wiring pattern 5, and conductive particles 7 other than sandwiched conductive particles move to the vicinity thereof to some extent.

Here, the diameter of the second filler particles F2 contained in the second film-like adhesive layer 9 is, for example, 1.8 μm on average and 8 μm at the maximum, and the second filler F2 flows at the first pressurization heating step S4. The diameter of the conductive particle 7 contained in the first film-like adhesive layer 6 is, for example, 5 μm, and the diameter of the the first filler particles F1 is 1.2 μm on average and 5 μm or less at the maximum.

After the second pressurization heating step S5, only the conductive particles 7 positioned between the protrusion electrode 3 and the wiring pattern 5 are sandwiched between the protrusion electrode 3 and the wiring pattern 5.

Even when there is a little unevenness on the IC 2 and the printed wiring board 4, since the conductive particles 7 exist between the IC 2 and the electrode of the printed wiring board 4, unevenness of each electrode can be filled, the connection reliability is sufficiently ensured, and electrically reliable connection can be achieved.

In the preferred embodiment of the present invention described above, the thickness of the film-like adhesive layer containing conductive particles is set to from about the same thickness as the diameter of the conductive particles up to about 4 times the diameter, and thus the conductive particles 7 are not exposed from and fallen away from the first binder 8, and the conductive particles 7 are more reliably sandwiched between the protrusion electrode 3 of the IC 2 and the wiring pattern 5 formed on the printed wiring board 4.

In the preferred embodiment of the present invention described above, since the viscosity of the first film-like adhesive layer 6 containing the conductive particles 7 is made higher and the viscosity of the second film-like adhesive layer 9 composed of the second binder and the second filler is made lower, the second film-like adhesive layer 9 composed of the second binder and the second filler easily flows at the time of heating and pressurization, whereby the conductive particles 7 are reliably sandwiched between the protrusion electrode 3 of the IC and the wiring pattern 5 formed on the printed wiring board 4.

In order to make the viscosity of the second film-like adhesive layer 9 lower than that of the first film-like adhesive layer 6 containing the conductive particles 7, the diameter of the second filler particles F2 contained in the second film-like adhesive layer 9 is made larger than that of the first filler particles F1 contained in the first film-like adhesive layer 6 containing the conductive particles 7. Thus, even when the elements of each binder of the first and second film-like adhesive layers are the same, a difference between the viscosity of the first film-like adhesive layer and the viscosity of the second film-like adhesive layer can be given.

As the fillers contained in the adhesive layers, by selecting a material by which the water absorption coefficient and/or the linear expansion coefficient of an adhesive layer can be reduced, electrical connection reliability of a wiring pattern on a circuit substrate and a protrusion electrode of an electrical component can be improved. A material having the effect for that purpose is, for example, ceramics such as silica and alumina typically.

In the preferred embodiment of the present invention described above, since the elements of the first binder 8 in the first film-like adhesive layer 6 containing the conductive particles 7 and the elements of the second binder 9A of the second film-like adhesive layer 9 are the same or approximately similar, at the time of heating and flowing, even when the first binder 8 and the second film-like adhesive layer 9 composed of the second binder 9A and the second filler F2 are mixed, the mixing does not exert a bad influence on the connection reliability.

In the preferred embodiment of the present invention described above, when the viscosity of the first film-like adhesive layer 6 containing the conductive particles 7 is higher than that of the second film-like adhesive layer 9, the first film-like adhesive layer 6 containing the conductive particles 7 can maintain the film shape thereof at the temperature and in a range of the vicinity of that temperature (±20° C.) at which the viscosity of the first film-like adhesive layer 6 containing the conductive particles 7 and the viscosity of the second film-like adhesive layer 9 become the lowest, whereby the conductive particles 7 can be reliably sandwiched between the protrusion electrode 3 of the IC 2 and the wiring pattern 5 formed on the printed wiring board 4.

As described above, with the present invention, regardless of a little unevenness on the wiring pattern 5 formed on the printed wiring board 4, an electrical connection member and an electrical connection method through which an electrical connection via the conductive particles 7 can be achieved can be realized.

By employing the first film-like adhesive layer 6 containing the conductive particles 7, which is a high viscosity film-like connection resin and the second film-like adhesive layer 9 which is a low viscosity connection resin, the conductive particles 7 are made to exist between a protrusion electrode of an electrical component such as a bare chip and a conductive pattern of an object, and an electrical connection can be reliably obtained.

Performed is positioning of the first film-like adhesive layer 6 whose thickness is set to from approximately the same as the diameter of the conductive particles up to about 4 times the diameter of the conductive particles and the second film-like adhesive layer 9 which is arranged over the first film-like adhesive layer 6 and is formed of a binder with the same reactivity as that of an element of the binder of the first film-like adhesive layer 6 so that the wiring pattern of the object and the protrusion electrode of the IC correspond to each other, and after pressurization, the electrical connection is performed reliably through heating and pressurization.

Further, after the first pressurization heating step is performed at the temperature and in a temperature range of the vicinity thereof (±20° C.) at which the viscosity of the first film-like adhesive layer 6 and the viscosity of the second film-like adhesive layer 9 become the lowest, the second pressurization heating step is performed where the first binder 8 of the first film-like adhesive layer 6 and the second binder 9A of the second film-like adhesive layer 9 are heated at a temperature higher than the reaction start temperature of the first binder 8 and the second binder 9A so that both adhesive layers can be efficiently hardened.

As a result of this, at the time of the first pressurization, only the second film-like adhesive layer 9 containing the second binder 9A composed of a binder having the same reactivity as that of an element of the first binder 8 in the first film-like adhesive layer 6 flows, and the protrusion electrode of the IC and the wiring pattern on the object are electrically connected via the conductive particles 7 of the first film-like adhesive layer 6.

In the embodiment of the present invention, the thickness of the first film-like adhesive layer 6 with conductivity is set to from about the same thickness as the diameter of the conductive particle 7 up to about 4 times the diameter of the conductive particle 7.

As a result, when the electrical connection is performed in a fine pitch, since only the conductive particles contributing to the electrical connection exist, the number of the conductive particles existing in the adhesive layer can be increased. Furthermore, since the total number of the conductive particles can be reduced than that in a conventional adhesive member, insulation property in the adjacent electrodes is further ensured.

Thus, the conductive particles do not protrude from the film-like adhesive layer containing the conductive particles.

In the embodiment of the present invention, preferably the conductive particles have approximately uniform particle diameter, and the material of the film-like binder composed of a binder and a filler is the same as that of the binder of the film-like binder containing the conductive particles or is a similar material.

Thus, the binder of the two-layer film-like adhesive layer reacts through pressurization and heating so that the first object and the second object can be connected. Since the conductive particles have an approximately uniform particle diameter, the electrical connection portion of the first object and the electrical connection portion of the second object can be electrically connected without rising while having a shape sandwiching the conductive particles reliably.

Suppose the material of the second binder of the second film-like adhesive layer is different from the material of the first binder of the first film-like adhesive layer, after both the binders are hardened while being mixed, inferred is a possibility that a problem of connection reliability occurs.

The viscosity of the second film-like adhesive layer is made to become extremely lower than the viscosity of the first film-like adhesive layer preferably in the heating process.

The viscosity of the second film-like adhesive layer is not always required to be low at a room temperature, and it is necessary for the viscosity of the second film-like adhesive layer to be extremely lower than that of the first film-like adhesive layer in the process of the thermocompression bonding. On the other hand, when the viscosity of the second film-like adhesive layer is too low at a room temperature, sticking work becomes hard to do.

The thickness of the first film-like adhesive layer may be a thickness which can be ensured by the conductive particles, and the thickness of the second film-like adhesive layer has to have a thickness with which the second film-like adhesive layer is reliably filled so that voids do not exist between the first object and the second object.

Since the viscosity of the second binder is set to a value lower than that of the first binder, the second film-like adhesive layer between the first object and the second object flows preferentially by heating and pressurization, and thus the first film-like adhesive layer containing the conductive particles does not move, whereby the position of the conductive particles can be maintained surely.

The content by amount of the second filler contained in the second film-like adhesive layer is set to a value smaller than that of the first filler contained in the first film-like adhesive layer. Since the content of the second filler is set to a content smaller than the content of the first filler, it is possible to make the viscosity of the second film-like adhesive layer having the second filler whose content is small lower and the viscosity of the first film-like adhesive layer containing the first filler higher.

Figure 7:
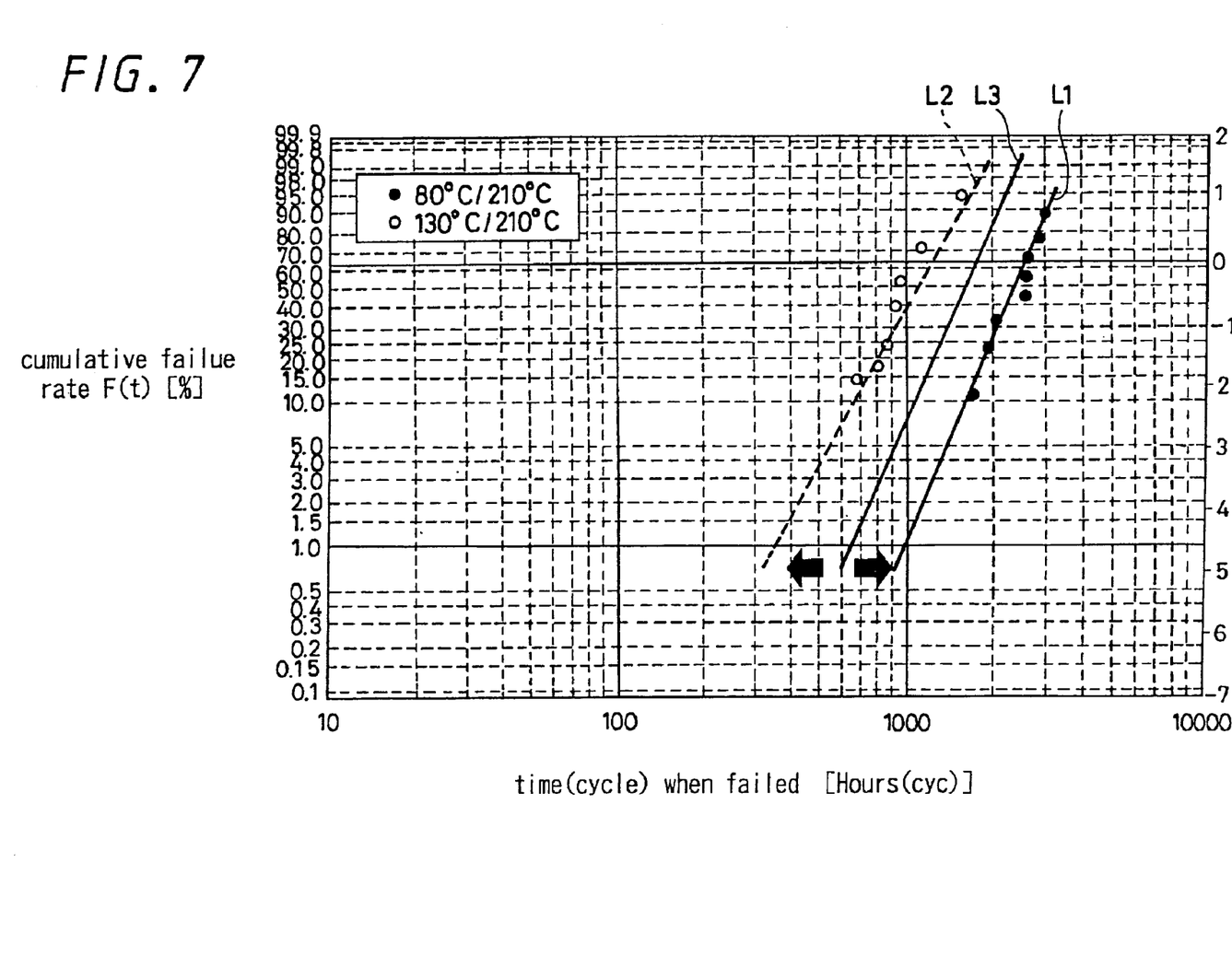
FIG. 7 is a graph showing a measurement example of electrical reliability in a case where the electrical connection material is employed.

FIG. 7 shows an example that is a measurement result of fraction defective with respect to time elapse, that is, an example of reinforcement of electrical connection reliability by employing electrical connection materials when an electrical connection is performed employing the electrical connection material of the present invention.

In FIG. 7, in a case where the printed wiring board 4 in FIG. 1 is not baked, since moisture contained in the printed wiring board 4 enters the first film-like adhesive layer and second film-like adhesive layer side, when the moisture enters the adhesive layers, not only there is a possibility that hardening physicality is deteriorated, but also adhesive strength with an object is drastically reduced, and as a result, reflow heat resistance and/or temperature cycle life are extremely worsened. It is preferable that the printed wiring board 4 in FIG. 1 is baked, for example, at 210° C.

Straight line L1 in FIG. 7 shows an example in which the printed wiring board 4 and the IC 2 in FIG. 1 are temporarily attached by pressure, for example, at 80° C. and are permanently attached by pressure at 210° C.

Straight line L2 in FIG. 7 shows an example in which the printed wiring board 4 and the IC 2 are temporarily attached by pressure, for example, at 130° C. and are permanently attached by pressure at 210° C.

Straight line L3 is the result at the time when the printed wiring board and the IC 2 are constantly heated at 210° C.

The straight line L1 and the straight line L2 exist in the opposite sides sandwiching the straight line L3, and the straight line L1 can maintain electrical connection reliability for a long time as compared with the case of the straight line L2. That is, the straight line L1 has a high electrical connection reliability, however, electrical connection reliability is deteriorated in the case of the straight line L2. This means that since a difference does not occur in the viscosities of the first film-like adhesive layer and the second film-like adhesive layer at 130° C. (refer to FIG. 8 and FIG. 9), reliable connection of conductive particles is not possible. Further, half-finished hardening of a binder progresses, and hardening in an ideal hardening state is not possible at the permanent pressurized attachment thereafter (210° C.). As a result, connection reliability in the case of the straight line L2 is worsened than in the case of the straight line L3 that is a result data of constant heating.

The present invention is not limited to the embodiment described above.

In the embodiment described above, although the first object is the printed wiring board 4 having the wiring pattern 5 and the second object is the IC 2 having the protrusion electrode 3, others can be adopted for each one. For example, as the first object, instead of the printed wiring board 4, another kind such as a glass substrate having the wiring pattern 5 can also be adopted. As the second object, instead of the IC 2, a different feature of electrical component can also be adopted.

As the shape of the protrusion electrode 3, one such as a plated bump can be adopted. The shape of the conductive particle 7 is not limited to being globular, and other shapes can also be adopted.

It is needless to say that the present invention is not limited to the above-described embodiment and that other various structures can be adopted thereto without departing from the gist of the present invention.

What is claimed is:

1. An electrical connection method for electrically connecting an electrical connection portion of a first object and an electrical connection portion of a second object, said method comprising the steps of:

providing an adhesive layer arrangement in which a first film-like adhesive layer composed of a plurality of conductive particles, a first binder containing said conductive particles, and a first filler is provided on the electrical connection portion of said first object and a second film-like adhesive layer composed of a second binder and a second filler is provided across a major surface of said first film-like adhesive layer;

heating and pressurization at a temperature and under a pressure at which said second film-like adhesive layer has a viscosity lower than that of said first film-like adhesive layer;

bringing together said electrical connection portions of said first and second objects sufficiently to cause said electrical connection portion of said second object to penetrate said second film-like adhesive layer for electrically connecting the electrical connection portion of said first object and the electrical connection portion of said second object by means of said conductive particles of said first film-like adhesive layer; and heating said resultant arrangement at a temperature sufficient to cause said first and second film-like adhesive layers to cure into sufficiently harden states.

2. The electrical connection method according to claim 1, wherein said step of heating and pressurizing comprises a first pressurization heating step for heating and pressurizing said first film-like adhesive layer and said second film-like adhesive layer in a temperature range of +/−20 degrees C. centered at a temperature at which the viscosity of said second film-like adhesive layer becomes the lowest and said step of heating said resultant arrangement comprises heating and pressurizing said first film-like adhesive layer and said second film-like adhesive layer at a temperature higher than reaction start temperature of said first film-like adhesive layer and said second film-like adhesive layer.

3. The electrical connection method according to claim 2, wherein, even in a temperature range of +/−20 degrees C. centered at a temperature at which the viscosity of said second film-like adhesive layer becomes the lowest, the viscosity of said first film-like adhesive layer containing said conductive particles is higher than the viscosity of said second film-like adhesive layer, said second film-like adhesive layer is fluidized, said first film-like adhesive layer containing said conductive particles is not fluidized, and said conductive particles in said first film-like adhesive layer are made to exist between a wiring pattern on a circuit substrate and a protrusion electrode of an electrical component to electrically connect the wiring pattern and the protrusion electrode.

4. The electrical connection method according to claim 2, wherein the temperature at which the viscosity of said second film-like adhesive layer becomes the lowest is 80 degrees C.

* * * * *